(12) United States Patent
Chen et al.

(10) Patent No.: US 12,712,556 B2
(45) Date of Patent: Aug. 18, 2026

(54) PHASE ALIGNMENT SYSTEM AND METHOD

(71) Applicant: QUALCOMM INCORPORATED, San Diego, CA (US)

(72) Inventors: Wu-Hsin Chen, San Diego, CA (US); Jingcheng Zhuang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 26 days.

(21) Appl. No.: 18/896,997

(22) Filed: Sep. 26, 2024

(65) Prior Publication Data

US 2026/0088824 A1 Mar. 26, 2026

(51) Int. Cl.
*H03L 7/197* (2006.01)
*H03K 5/14* (2014.01)
*H03L 7/081* (2006.01)
*H04B 1/40* (2015.01)
*H04B 7/06* (2006.01)

(52) U.S. Cl.
CPC .......... *H03L 7/1976* (2013.01); *H03L 7/0812* (2013.01); *H03K 5/14* (2013.01); *H04B 1/40* (2013.01); *H04B 7/0671* (2013.01)

(58) Field of Classification Search
CPC ....... H03L 7/1976; H03L 7/0812; H03K 5/14; H04B 1/40; H04B 7/0671
USPC .................................... 327/22, 158; 375/376
See application file for complete search history.

*Primary Examiner* — Regis J Betsch
*Assistant Examiner* — Amit R Bhatia
(74) *Attorney, Agent, or Firm* — Smith Tempel Blaha LLC

(57) ABSTRACT

A system for phase alignment includes a radio frequency integrated circuit (RFIC) having a phase locked loop (PLL) circuit and a missing pulse detection circuit, the missing pulse detection circuit configured to detect a missing pulse from a reference clock source and generate a detection pulse signal, and a counter reset circuit connected to the missing pulse detection circuit, the counter reset circuit configured to generate a counter reset signal in response to the detection pulse signal, the counter reset signal configured to establish an absolute time and frequency reference for the PLL circuit.

20 Claims, 11 Drawing Sheets

PHASE ALIGNMENT SYSTEM AND METHOD

FIELD

The present disclosure relates generally to electronics, and more specifically to phase control for beamforming in transmitters in transceivers.

BACKGROUND

Wireless communication devices and technologies are becoming ever more prevalent as are communication systems that operate at millimeter-wave (mmW) and at near-mmW frequencies. Existing and emerging technologies make use of signal beamforming to maximize available bandwidth and make efficient use of communication spectrum. Beamforming generally uses multiple transmit and receive antennas typically arranged in an array where each antenna in the array may use a signal that may have a different phase that the signal from another antenna in the array. In some systems, a single intermediate frequency integrated circuit (IFIC) will provide communication and control signals to multiple millimeter wave (mmW) radio frequency integrated circuits (RFICs). Each of the multiple RFICs may be connected to a dedicated antenna or antenna array and each RFIC may be responsible for providing a different phase signal to and receiving a different phase signal from the respective antenna or antennas. Among the challenges in such an arrangement is providing clocking information that the multiple RFICs can use to provide the correct phase signal to and from each antenna.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a system for phase alignment including a radio frequency integrated circuit (RFIC) having a phase locked loop (PLL) circuit and a missing pulse detection circuit, the missing pulse detection circuit configured to detect a missing pulse from a reference clock source and generate a detection pulse signal, and a counter reset circuit connected to the missing pulse detection circuit, the counter reset circuit configured to generate a counter reset signal in response to the detection pulse signal, the counter reset signal configured to establish an absolute time and frequency reference for the PLL circuit.

Another aspect of the disclosure provides a method for phase alignment including detecting a missing pulse in a clock signal, generating a detection pulse signal, and generating a counter reset signal to reset a counter in response to the detection pulse signal, wherein resetting the counter establishes an absolute time and frequency reference.

Another aspect of the disclosure provides a device including means for detecting a missing pulse in a clock signal, means for generating a detection pulse signal and means for generating a counter reset signal to reset a counter in response to the detection pulse signal, wherein resetting the counter establishes an absolute time and frequency reference.

BRIEF DESCRIPTION OF THE DRAWINGS

In the figures, like reference numerals refer to like parts throughout the various views unless otherwise indicated. For reference numerals with letter character designations such as "102*a*" or "102*b*", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration. " Any aspect described herein as "exemplary" is not necessarily to be construed as preferred or advantageous over other aspects.

When providing clocking information that multiple RFICs can use to provide the correct phase signal to and from each antenna, the clocking information is generally used by a frequency synthesizer having a phase locked loop (PLL) that is associated with each RFIC. The PLL generates the correct phase for each RFIC. A PLL can be an integer PLL where the frequency control is provided by integer (integer-N) control signals, or can be a fractional PLL, where the frequency control is provided by non-integer (fractional-N) control signals.

When performing beamforming across multiple RFICs, the phase drift at a fractional-N PLL output poses a fundamental challenge. Since the output frequency of a fractional-N PLL generally does not match the target frequency, the phase of the PLL output may drift slowly. This phase drift is affected by differences in the time that each RFIC is activated, and time delay differences between RFICs. Current mmW RFICs generally use an integer-N PLL to avoid the phase drift. However, this sets a limit for the frequency plan since an integer-N PLL is very limited on the different frequencies it can generate. Therefore, it would be desirable to have the ability to align the phase of a fractional-N PLL among multiple mmW RFICs in a transceiver.

In an exemplary embodiment, a phase alignment system and method allows the use of a fractional-N frequency synthesizer and phase locked loop (PLL) to be used in a beamforming mmW communication system where multiple RFICs are used in a beamforming array.

In an exemplary embodiment, a phase alignment system and method allows a single intermediate frequency integrated circuit (IFIC) to provide a clocking signal to an array of multiple RFICs.

In an exemplary embodiment, a phase alignment system and method allows simultaneous phase alignment for an array of RFICs associated with an intermediate frequency integrated circuit (IFIC).

Figure 1:
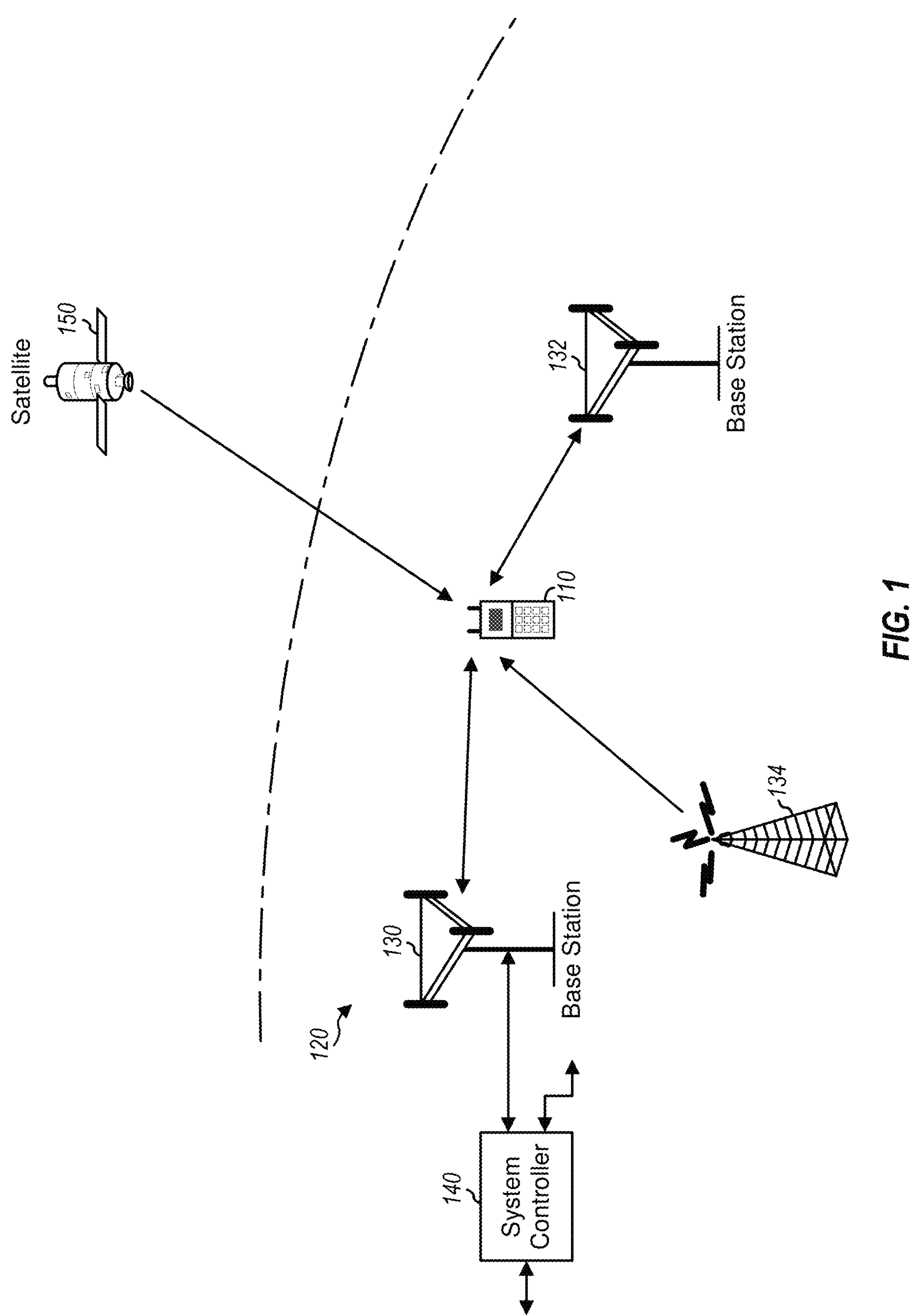
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a customer premises equipment (CPE), such as a modem, a router, a switch, a wireless access point (WAP), a wide area network (WAN) device, a local area network (LAN) device, or other networking equipment.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc.

Wireless device 110 may communicate with wireless communication system 120. Wireless device 110 may also receive signals from broadcast stations (e.g., a broadcast station 134) and/or signals from satellites (e.g., a satellite 150 in one or more global navigation satellite systems (GNSS)), etc.). Wireless device 110 may support one or more radio technologies for wireless communication such as LTE, WCDMA, CDMA 1X, EVDO, TD-SCDMA, GSM, 802.11, 802.15, 5G, Sub6 5G, 6G, Ultra Wideband (UWB), etc.

Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
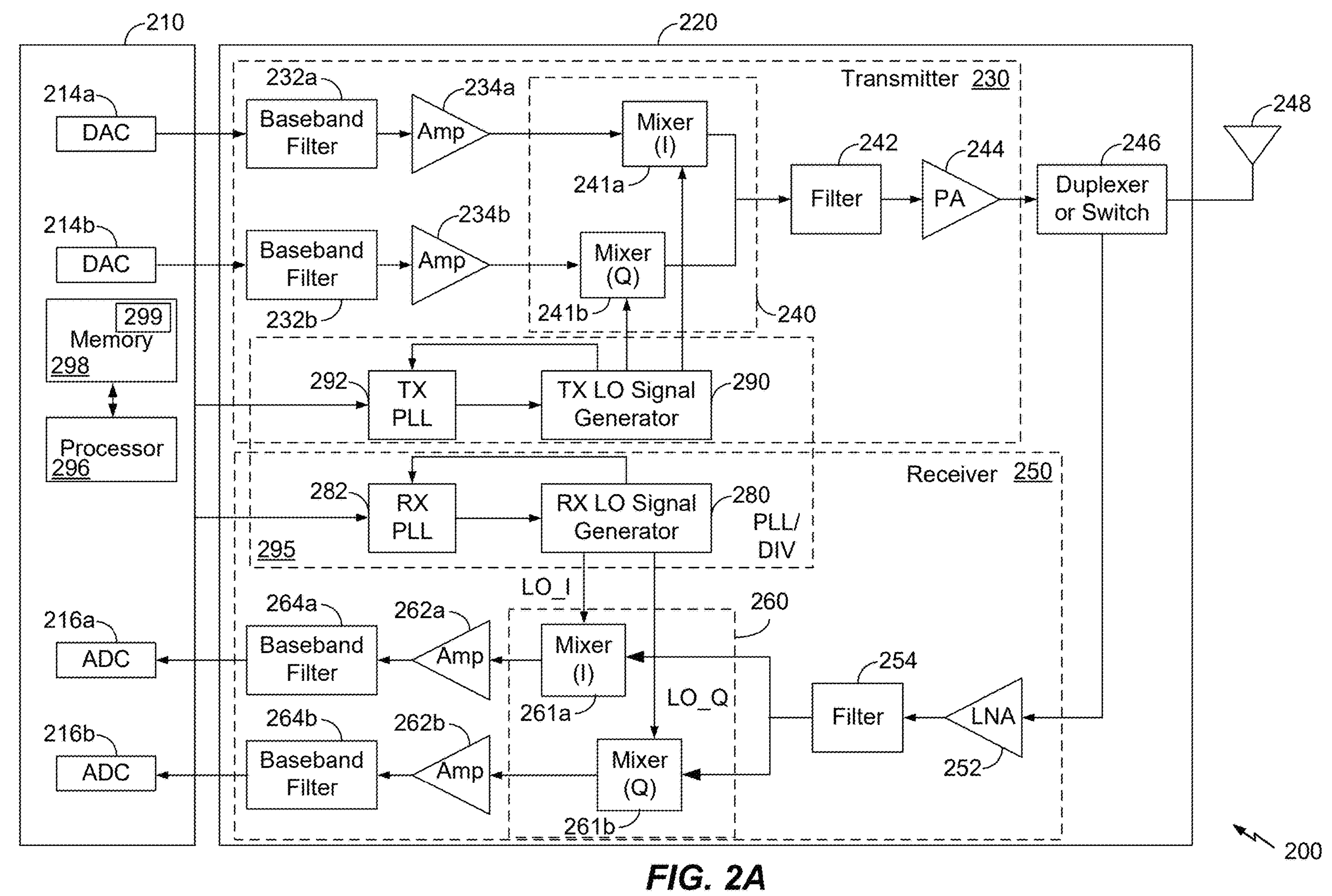
FIG. 2A is a block diagram showing a wireless device in which exemplary techniques of the present disclosure may be implemented.

FIG. 2A is a block diagram showing a wireless device 200 in which the exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250, for example phase shifters as discussed further below. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) **214*a* and 214*b* for converting digital signals generated by the data processor 210 into the I and Q analog output signals, e.g., I and Q output currents, for further processing. In other embodiments, the DACs 214*a* and 214*b* are included in the transceiver 220 and the data processor 210 provides data (e.g., for I and Q) to the transceiver 220** digitally.

Within the transmitter 230, lowpass filters 232*a* and 232*b* filter the I and Q analog transmit signals, respectively, to remove undesired images caused by the prior digital-to-analog conversion. Amplifiers (Amp) 234*a* and 234*b* amplify the signals from lowpass filters 232*a* and 232*b*, respectively, and provide I and Q baseband signals. An upconverter 240 having upconversion mixers 241*a* and 241*b* upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248, or alternatively it can be sent to a separate transmit antenna different from a separate receive antenna. While examples discussed herein utilize I and Q signals, those of skill in the art will understand that components of the transceiver may be configured to utilize polar modulation.

In the receive path, antenna 248 receives communication signals and provides a received RF signal, which can be routed through duplexer or switch 246 and provided to a low noise amplifier (LNA) 252. The duplexer 246 is designed to operate with a specific RX-to-TX duplexer frequency separation, such that RX signals are isolated from TX signals. Alternatively, there may be a separate transmit antenna and separate receive antenna as mentioned above, in which case RX-to-TX isolation can be achieved through the limited coupling between the two antennas. In the case of separate RX and TX antennas, the RX antenna can be coupled directly to LNA 252. The received RF signal is amplified by LNA 252 and filtered by a filter 254 to obtain a desired RF input signal. Downconversion mixers 261*a* and 261*b* in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262*a* and 262*b* and further filtered by lowpass filters 264*a* and 264*b* to obtain I and Q analog input signals, which are provided to data processor 210. In the exemplary embodiment shown, the data processor 210 includes analog-to-digital-converters (ADC's) 216*a* and 216*b* for converting the analog input signals into digital signals to be further processed by the data processor 210. In some embodiments, the ADCs 216*a* and 216*b* are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

In an exemplary embodiment, the RX PLL 282, the TX PLL 292, the RX LO signal generator 280, and the TX LO signal generator 290 may alternatively be combined into a single LO generator circuit 295, which may include common or shared LO signal generator circuitry to provide the TX LO signals and the RX LO signals. Alternatively, separate LO generator circuits may be used to generate the TX LO signals and the RX LO signals.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the filter 242, PA 244, LNA 252 and filter 254 may be implemented separately from other components in the transmitter 230 and receiver 250, and may be implemented on a millimeter wave integrated circuit. An example super-heterodyne architecture is illustrated in FIG. 2B.

Figure 2B:
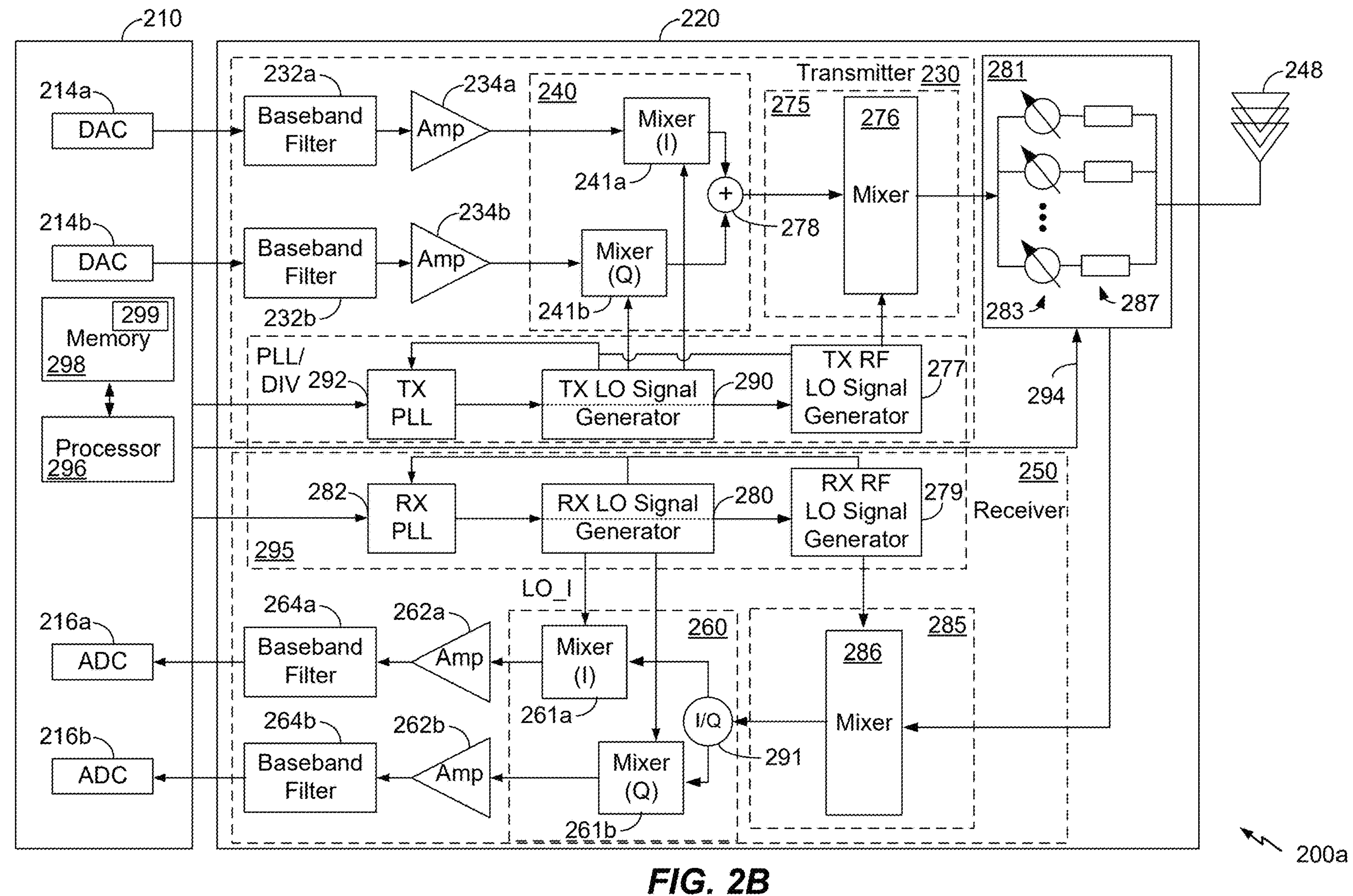
FIG. 2B is a block diagram showing a wireless device in which exemplary techniques of the present disclosure may be implemented.

FIG. 2B is a block diagram showing a wireless device in which the exemplary techniques of the present disclosure may be implemented. Certain components, for example which may be indicated by identical reference numerals, of the wireless device 200*a* in FIG. 2B may be configured similarly to those in the wireless device 200 shown in FIG. 2A and the description of identically numbered items in FIG. 2B will not be repeated.

The wireless device 200*a* is an example of a heterodyne (or superheterodyne) architecture in which the upconverter 240 and the downconverter 260 are configured to process a communication signal between baseband and an intermediate frequency (IF). For example, the upconverter 240 may be configured to provide an IF signal to an upconverter 275. In an exemplary embodiment, the upconverter 275 may comprise upconversion mixer 276. The summing function 278 of upconverter 240 combines the I and the Q outputs and provides a combined signal to the mixer 276. The combined signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and power amplifiers. In some embodiments, the phase shifters 283 may be incorporated within respective phased array elements 287. Exemplary embodiments of the phase alignment system and method described herein may be implemented in the phase shift circuitry 281.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a downconversion mixer 286. In an exemplary embodiment, the mixer 286 downconverts the receive RF signal provided by the phase shift circuitry 281 to an IF signal according to RX RF LO signals provided by an RX RF LO signal generator 279. The I/Q generation function 291 of downconverter 260 receives the IF signal from the mixer 286 and generates I and Q signals in downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect. For example, components of the antenna array 248 may be implemented on a substrate and coupled to an integrated circuit implementing the phase shift circuitry 281 via a flexible printed circuit or the chip may be mounted on the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 7 GHz (e.g., the FR1 frequency band) using the architecture illustrated in FIG. 2A and to communicate with signals having a frequency above about 24 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B.

Figure 2C:
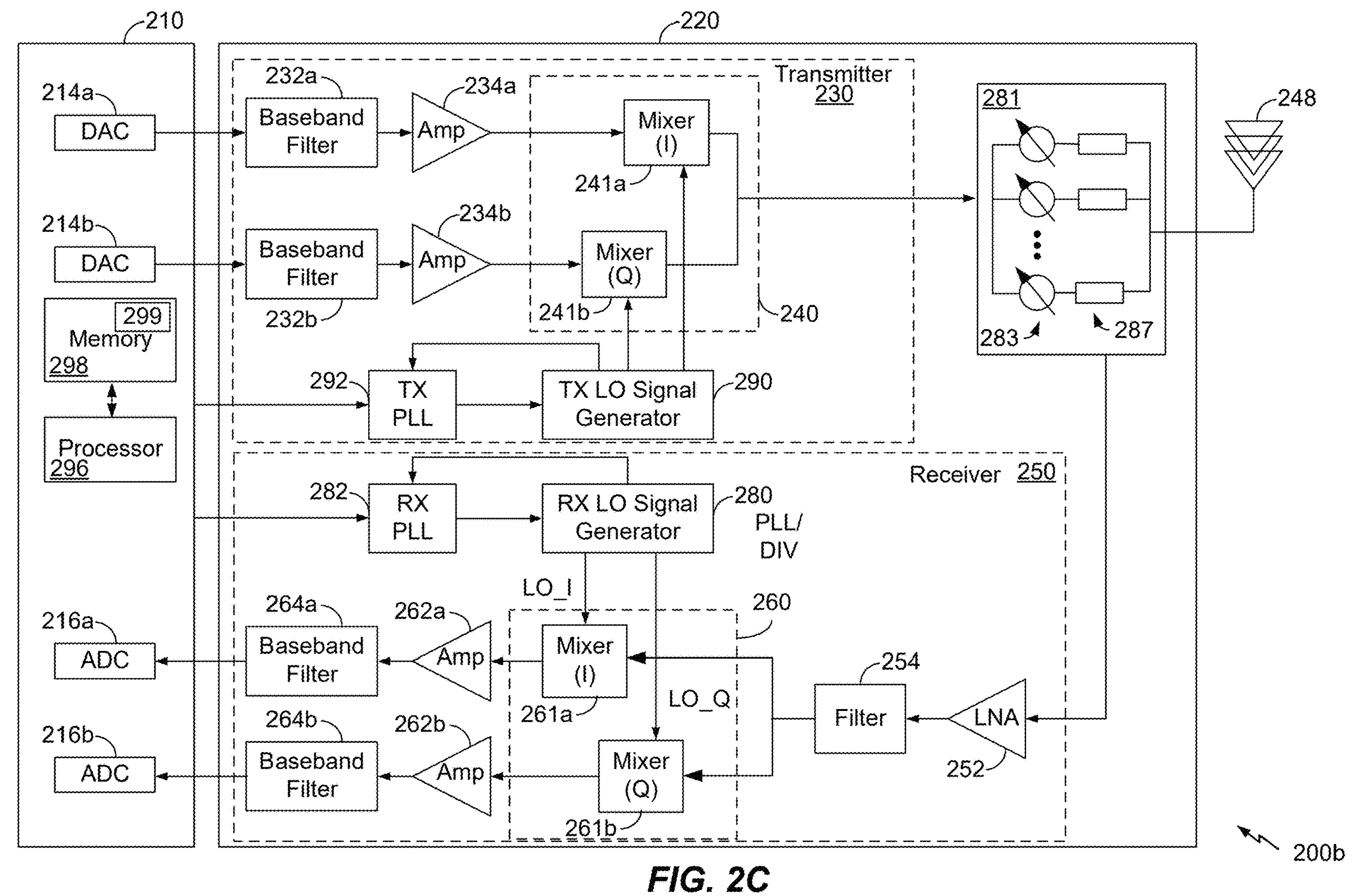
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200*b* in FIG. 2C may be configured similarly to those in the wireless device 200 shown in FIG. 2A and/or the wireless device 200*a* shown in FIG. 2B and the description of identically numbered items in FIG. 2C will not be repeated.

The wireless device 200*b* in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. Such an architecture may be referred to as a low IF (LIF), or a zero IF (ZIF) architecture. For example, the LO signals in the architecture of FIG. 2C may comprise signals at frequencies of tens of GHz. In other examples, the LO signals may be a single digit or low double digit GHz frequency (for example, when the wireless device 200*b* is configured for use with signals in an FR3 band) or hundreds of GHz (for example, when the wireless device 200*b* is configured for use with signals in a sub-THz band).

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate. In some embodiments, multiple iterations of the upconverter 240 and downconverter 260 may be implemented to process multiple signals on different frequency bands.

Figure 3:
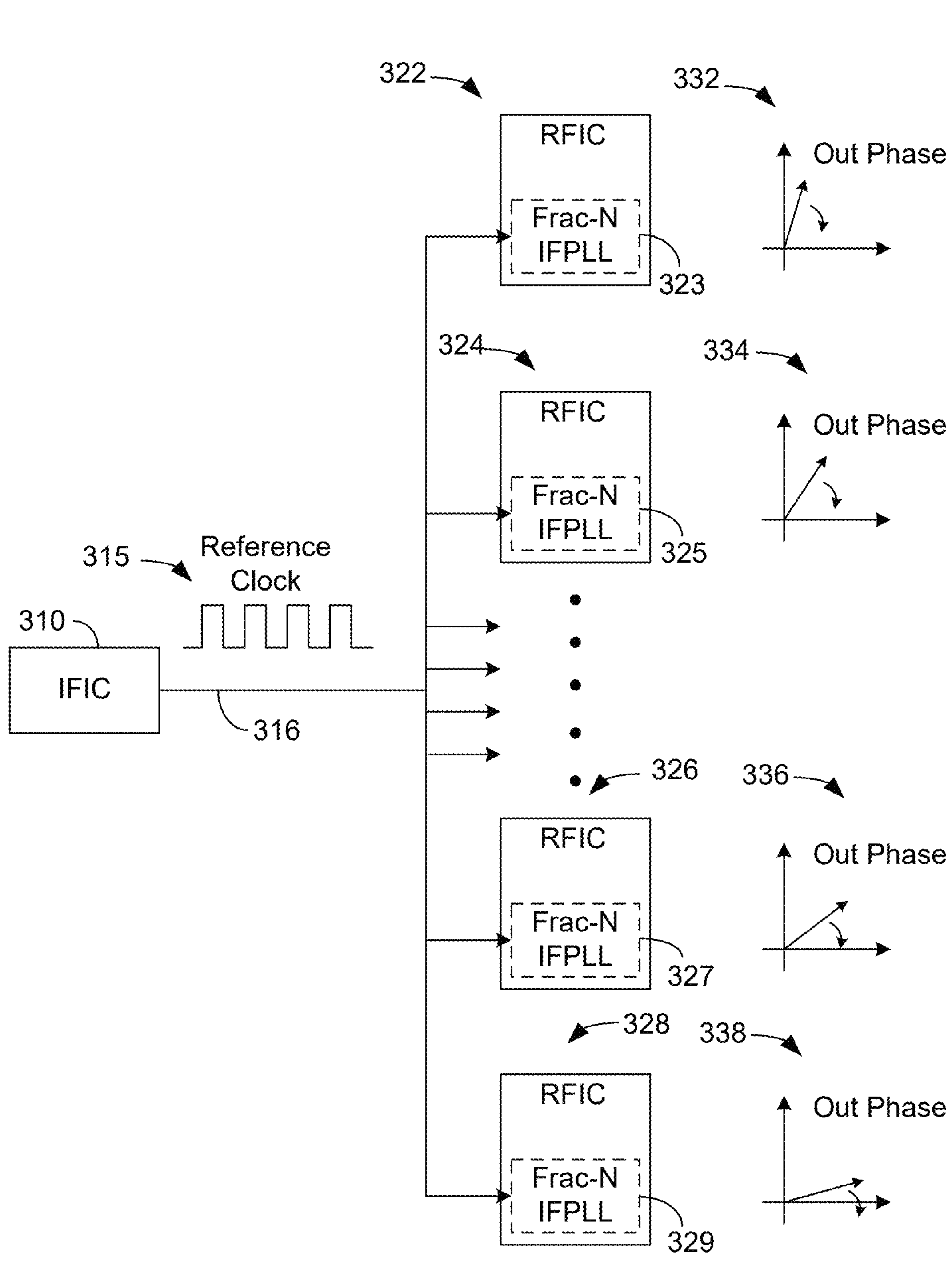
FIG. 3 shows a schematic diagram of a portion of a beamforming circuit in accordance with exemplary embodiments of the disclosure.

FIG. 3 shows a schematic diagram of a portion of a beamforming circuit 300 in accordance with exemplary embodiments of the disclosure. In an exemplary embodiment, the beamforming circuit 300 comprises an intermediate frequency integrated circuit (IFIC) 310 and one or more radio frequency integrated circuits (RFICs). One or more of the RFICs may be included in a module. For example, multiple (or all) RFICs may be included in respective modules. In other examples, several RFICs may be included in a common module. In some examples, certain RFIC may be in a module and certain may not. It is not required, however, that any of the RFICs be in a module. The number of RFICs is dependent upon application and therefore may vary from what is illustrated and described herein. In exemplary embodiments the number of RFICs may comprise a single RFIC (such as for example in a user equipment (UE) or may comprise multiple RFICs (such as eight (8) RFICs in a customer premises equipment (CPE)). When implemented in an array using multiple RFICs, the number of RFICs may be in multiples of eight (8). However, other numbers of RFICs are possible.

In the exemplary embodiment shown in FIG. 3, there are eight (8) RFICs, but four (4) RFICs are shown in detail for simplicity of illustration. Each RFIC may comprise multiple transmit/receive (TX/RX) elements each having an antenna (such as in the phase shift circuitry 281 of FIG. 2B/2C).

In an exemplary embodiment, although four RFICs 322, 324, 326 and 328 are shown for illustration, it is understood that there can be more than four RFICs in the beamforming system 300, such as eight (8) RFICs as mentioned above. Each RFIC includes a phase locked loop (PLL) circuit. For example, the RFIC 322 includes a PLL circuit 323, the RFIC 324 includes a PLL circuit 325, the RFIC 326 includes a PLL circuit 327, and the RFIC 328 includes a PLL circuit 329. Each PLL circuit 323, 325, 327 and 327 receives a reference clock signal 315 from the IFIC 310 over connection 316.

In an exemplary embodiment, each PLL circuit 323, 325, 327 and 329 may be configured as a fractional-N PLL, meaning that each PLL circuit 323, 325, 327 and 329 may be configured to provide non-integer frequency reference signals based on the reference clock 315.

In an exemplary embodiment, each RFIC 322, 324, 326 and 328 is configured to process a signal having a particular phase that may be different than the phase processed by other RFICs. For example, the RFIC 322 may be configured to process a signal having a phase shown using reference numeral 332, the RFIC 324 may be configured to process a signal having a phase shown using reference numeral 334, the RFIC 326 may be configured to process a signal having a phase shown using reference numeral 336, and the RFIC 328 may be configured to process a signal having a phase shown using reference numeral 338. In some embodiments, at least some of the phases shown using reference numerals 332, 334, 336 and 338 may be the same or may be different than each other.

In an exemplary embodiment, each RFIC may have multiple TX/RX elements and multiple antennas. However, each TX/RX element and each antenna on an RFIC will generally process the same input phase signal, although the output phase of each of these elements may vary (e.g., for beamforming, as described above).

In certain operating circumstances, the fractional-N PLL circuits 323, 325, 327 and 329 may suffer from a lack of ability to provide consistent output phase to the different RFICs in the beamforming circuit 300.

Figure 4:
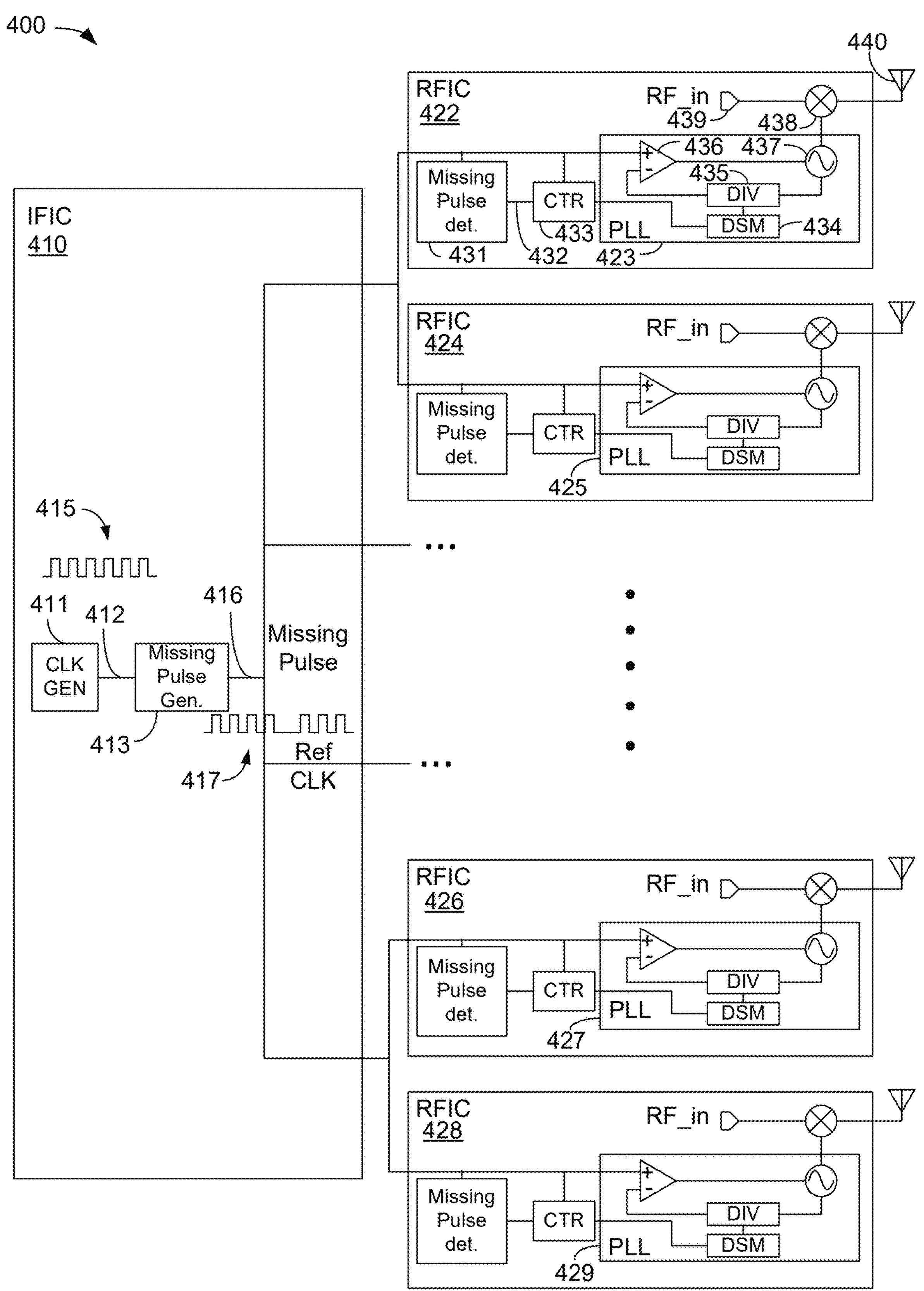
FIG. 4 shows a schematic diagram of a portion of a beamforming circuit in accordance with exemplary embodiments of the disclosure.

FIG. 4 shows a schematic diagram of a portion of a beamforming circuit 400 in accordance with exemplary embodiments of the disclosure. In an exemplary embodiment, the beamforming circuit 400 comprises an intermediate frequency integrated circuit (IFIC) 410 and one or more radio frequency integrated circuits (RFICs).

In the exemplary embodiment shown in FIG. 4, there are eight (8) RFICs, but four (4) RFICs are shown in detail for simplicity of illustration. Each RFIC may comprise multiple transmit/receive (TX/RX) elements each having an antenna (such as in the phase shift circuitry 281 of FIG. 2B/2C).

In an exemplary embodiment, although four RFICs 422, 424, 426 and 428 are shown for illustration, it is understood that there can be more than four (4) RFICs, such as eight (8) or more RFICs in the beamforming system 400. Each RFIC includes a phase locked loop (PLL) circuit. For example, the RFIC 422 includes a PLL circuit 423, the RFIC 424 includes a PLL circuit 425, the RFIC 426 includes a PLL circuit 427, and the RFIC 428 includes a PLL circuit 429. Each PLL circuit 423, 425, 427 and 427 receives a modified reference signal 417 from the IFIC 410 over connection 416. In an exemplary embodiment, the modified reference signal 417 has one or more missing clock pulses.

In an exemplary embodiment, each PLL circuit 423, 425, 427 and 429 may be configured as a fractional-N PLL, meaning that each PLL circuit 423, 425, 427 and 429 may be configured to provide non-integer frequency reference signals based on a reference clock.

In an exemplary embodiment, the IFIC 410 comprises a clock generator circuit 411 that provides a reference clock signal 415 over connection 412 to a missing pulse generator circuit 413. In an exemplary embodiment, the missing pulse generator circuit 413 takes the reference clock signal 415 on connection 412 and generates a modified reference signal 417 on connection 416 that is missing one or more clock pulses. The missing clock pulse or pulses in the modified reference signal 417 are detected by the RFICs 422, 424, 426 and 428 and used to align the timing and phase of each of the RFICs. For example, each of the RFICs 422, 424, 426 and 428 may generate a counter reset signal that can be used to align the timing and phase of the RFIC as will be described herein.

In accordance with an exemplary embodiment, each RFIC includes a missing pulse detection circuit, an optional counter and a fractional-N PLL circuit. Only the RFIC 422 will be described in detail with the understanding that each RFIC in the beamforming circuit 400 is configured similar to the RFIC 422.

In an exemplary embodiment, the RFIC 422 comprises a missing pulse detection circuit 431, a counter 433, a PLL circuit 423, an RF input port 439, and a mixer 438. The mixer 438 is connected to an antenna 440, which can also be an antenna array.

In an exemplary embodiment, the PLL circuit 423 comprises a delta-sigma modulator (DSM) 434, a divider 435, a comparator 436 and an oscillator 437. The DSM 434 generates a non-integer input to the divider 435, which determines a frequency to which the PLL circuit 423 will be set. The non-integer input provided by the DSM 434 to the divider 435 provides a wide range of available frequencies to which the PLL circuit 423 can be set. The comparator 436 compares the frequency of the signal from the divider 435 with the frequency of the modified reference signal 417 received over connection 416 from the IFIC 410 and provides the desired frequency to the oscillator 437. The output of the oscillator 437 is combined in the mixer 438 with the RF input signal on connection 439. The oscillator 437 may be a voltage controlled oscillator (VCO) for example.

In an exemplary embodiment, the RF input signal is provided over connection 439. The output of the fractional-N PLL 423 is combined with the RF input signal in the mixer 438 and provided to the antenna 440. Although a single antenna 440 is shown, there may be additional antennas or antenna elements in an antenna array. In an exemplary embodiment, the fractional-N PLL 423 generates a non-integer frequency reference signal to obtain a desired frequency signal at the antenna 440. Other elements may be included in the RFIC, for example phase shifters and amplifiers, as described above with respect to the phase shift circuitry 281.

In an exemplary embodiment, the missing pulse detection circuit 431 detects the missing pulse in the modified reference signal 417 and generates a detection pulse that resets the counter 433, which in turn resets the RFIC 422. Similar missing pulse detection circuits in the RFICs 424, 426 and 428 simultaneously detect the missing pulse in the modified reference signal 417 and simultaneously reset respective counters, which in turn simultaneously reset the respective RFICs 424, 426 and 428. In this manner, the simultaneous counter reset establishes an absolute time and frequency reference point for the PLL circuit 423 (and PLL circuits 425, 427 and 429), causing each RFIC 422, 424, 426 and 428 in the beamforming circuit 400 to initiate operation with an absolute time and frequency reference, thereby providing the ability to correctly align the phase of the respective output signals from each RFIC 422, 424, 426 and 428.

Figure 5:
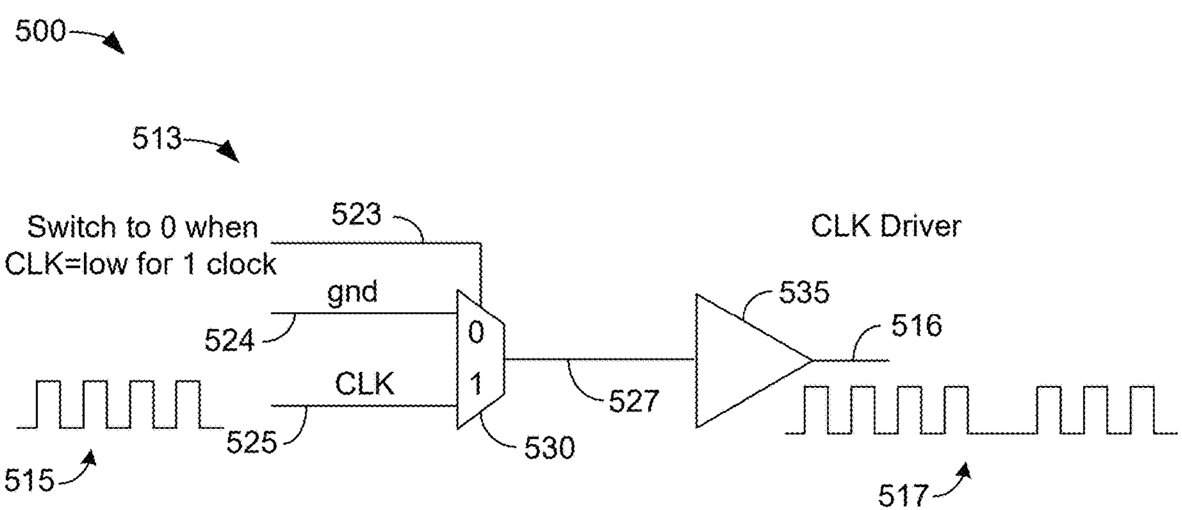
FIG. 5 is a diagram showing an exemplary embodiment of the missing pulse generator circuit of FIG. 4.
Figure 5:
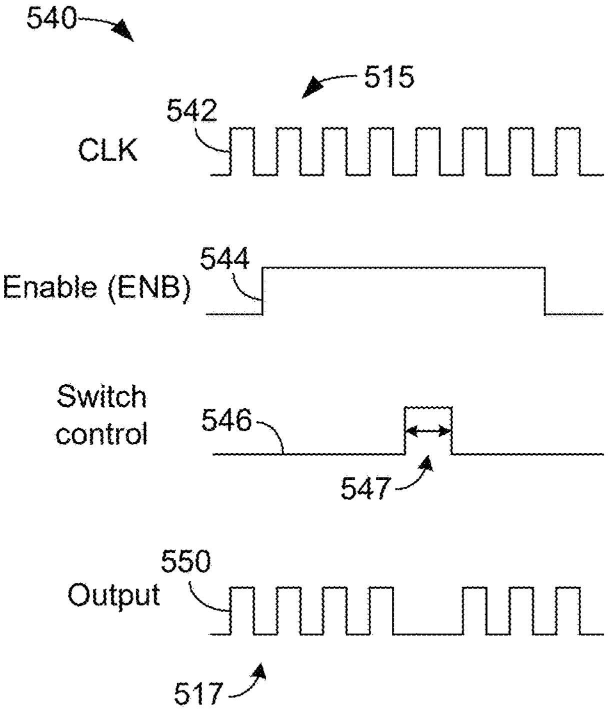

FIG. 5 is a diagram 500 showing an exemplary embodiment of the missing pulse generator circuit 413 of FIG. 4. In an exemplary embodiment, a missing pulse generator circuit 513 includes a multiplexer 530 and a clock driver 535. A reference clock signal 515 is provided over connection 525. The reference clock signal 515 is similar to the reference clock signal 415 of FIG. 4.

A system ground, gnd, is provided to the multiplexer 530 over connection 524 and a clock (CLK) signal is provided to the multiplexer 530 over connection 525.

A control signal is applied to the multiplexer 530 over connection 523. The control signal may be provided by the data processor 210 of FIG. 2B or FIG. 2C, or by anther controller. The control signal on connection 523 causes the multiplexer 530 to select the "gnd" input on connection 524 when the CLK signal is at a logic low responsive to the control signal on connection 523, thereby generating a modified reference signal having a missing clock pulse.

An output of the multiplexer 530 is provided over connection 527 to the clock driver 535. The clock driver 535 generates the modified reference signal 517 having a missing clock pulse, which is provided over connection 516. Connection 516 in FIG. 5 is similar to connection 416 in FIG. 4 and the modified reference signal 517 is similar to the modified reference signal 417 in FIG. 4.

Signals are shown using reference numeral 540. The reference clock signal is shown using reference numeral 542, an enable (EN) signal is shown using reference numeral 544. The enable (EN) signal is generated by the IFIC 410 (FIG. 4) when phase synchronization among the RFICs is desired (e.g., power on, system reset, etc.), and may be applied to circuitry of the multiplexer 530, or may be used as a gating signal in generation of the switch control signal.

The switch control signal applied at connection 523 above is shown using reference numeral 546, and the modified clock reference signal 517 having the missing pulse is shown using reference numeral 550. The signal 550 represents the modified reference signal 417 of FIG. 4 and is also the output of the clock driver 535 on connection 516. In an exemplary embodiment, the switch control signal 546 may have a tunable range shown using reference numeral 547. The tunable range 547 may comprise one or more missing clock pulses, and may be generated within the IFIC 410 and/or by a processor such as the modem.

Figure 6:
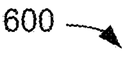
FIG. 6 is a diagram showing an exemplary embodiment of the missing pulse detection circuit of FIG. 4.
Figure 6:
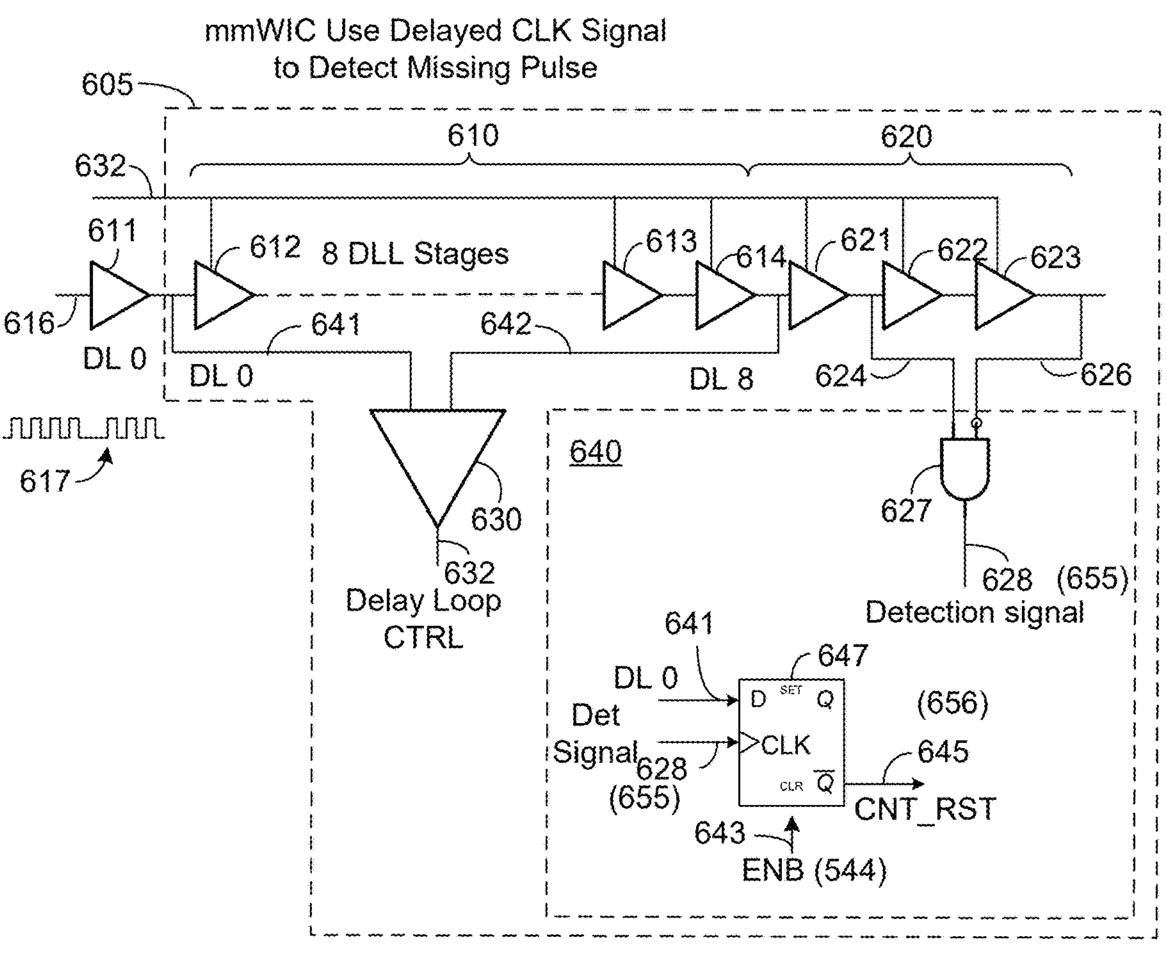
Figure 6:
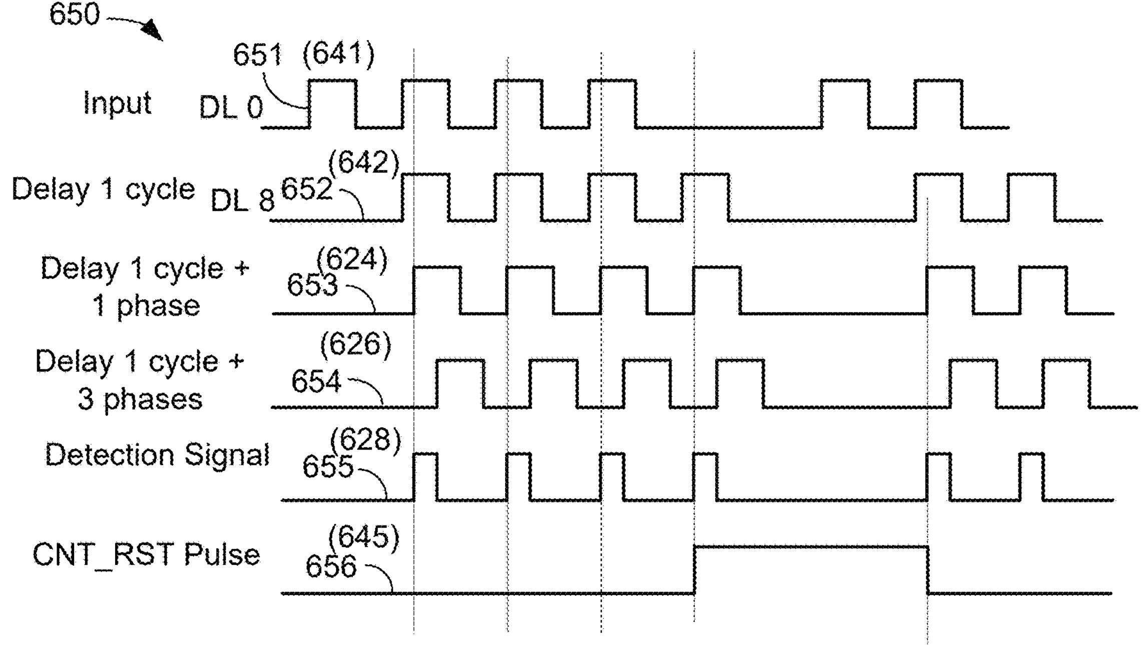

FIG. 6 is a diagram 600 showing an exemplary embodiment of the missing pulse detection circuit 413 of FIG. 4. In an exemplary embodiment, the missing pulse detection circuit 605 includes a delay line circuit 610, a detection circuit 620, a phase comparator and voltage generator circuit 630 and a counter reset circuit 640. The delay line circuit 610 may comprise eight (8) delay stages, shown using reference numerals 612, 613 and 614, where delay line stage 612 is a first delay line stage (DL 1) delay line stage 613 is a seventh delay line stage (DL 7) and delay line stage 614 is an eighth delay line stage (DL 8). A driver amplifier 611 may provide a modified reference signal 617 input from the connection 616 to the first delay line stage 612. The connection 616 is similar to the connection 416 in FIGS. 4 and 516 in FIG. 5, and an output of the driver amplifier 611 is also provided to the phase comparator and voltage generator circuit 630 over connection 641. An output of the eighth delay line stage 614 is provided to the phase comparator and voltage generator circuit 630 over connection 642. An output of the phase comparator and voltage generator circuit 630 is provided over connection 632 to the delay line stages 612-623 in the delay line circuit 610 and detection circuit 620. In an exemplary embodiment, the delay loop control signal on connection 632 is an analog voltage signal that controls the signal delay of the delay line stages in the delay line circuit 610 and detection circuit 620. The voltage generator circuit 630 compares the phase of the signal on connection 641 and the phase of the signal on connection 642 and generates the voltage on 632 that is used to shift the phase of the signal on connection 642 in order to align the phase between the signal on connection 641 and the signal on connection 642. When the loop is closed and locked, the signal on connection 642 is exactly a one cycle delay of the signal on connection 641. The waveform 651 is the waveform of the signal on connection 641 (DL0), and the waveform 652 is the waveform of the signal on connection 642 (DL8).

In an exemplary embodiment, the counter reset circuit 640 may be a digital circuit and includes an adder 627 and a flip-flop 647. In an exemplary embodiment, the flip-flop 647 may comprise a D-type flip-flop; however, other implementations are possible.

In an exemplary embodiment, the detection circuit 620 includes delay line stages 621, 622 and 623. In an exemplary embodiment, the amplifier 611 and the delay line stages 612 to 614 in the delay line circuit 610 and the delay line stages 621 to 623 in the detection circuit 620 are differential each having a positive and negative output. A positive output of the delay line stage 621 is provided to the adder 627 over connection 624. A negative output of the delay line stage 623 is provided to the adder 627 over connection 626. The adder 627 provides a detection pulse signal over connection 628. The signal on connection 628 is generated when the detection circuit 620 identifies the missing pulse in the modified reference signal 417 (FIGS. 4), 517 (FIG. 5).

In an exemplary embodiment, the missing pulse detection signal on connection 628 is provided to the CLK input of the flip-flop 647. The DL0 input on connection 641 is provided to the "D" input of the flip-flop 647. The enable signal (EN) 544 (FIG. 5) is applied to the flip-flop 647 over connection 643 when phase synchronization among the RFICs is desired (e.g., power on, system reset, etc.). The Qbar output of the flip-flop 647 is provided on connection 645 as a counter reset (CNT_RST) signal 656. The counter reset signal 656 is applied over connection 432 (FIG. 4) to the counter 433 (FIG. 4) in the RFIC 422 and in each of the RFICs 424, 426 and 428 to establish an absolute time and frequency reference point.

The drawing 600 also includes traces 650. The trace 651 shows a modified clock reference input signal 417, 517 (the signal on connection 416 of FIG. 4, and connection 516 of FIG. 5).

The trace 652 shows the clock signal 651 delayed by one (1) cycle, the trace 653 shows the clock signal 651 delayed by one (1) cycle plus one (1) phase (25% of one cycle), and the trace 654 shows the clock signal 651 delayed by one (1) cycle plus three (3) phases.

The trace 655 shows the detection signal (on connection 628) and the trace 654 shows the counter reset (CNT_RST) signal on connection 645.

The modified reference signal 617 is the clock signal for each RFIC (FIG. 4) and can be used to detect the missing pulse in order to establish the absolute timing and frequency reference. A delayed version of the modified reference signal 617 is created by the delay line circuit 610 and used to detect the missing pulse. However, circuit delay can be affected by process, voltage, and temperature variations in addition to other analog effects. Accordingly, the delay line circuit 610 is used to ensure that the detection signal is delayed exactly one (1) cycle (from DL0 to DL8), thus removing analog impairments using a negative feedback loop created by the phase comparator and voltage generator circuit 630. The waveform 651 corresponds to the DL0 output on connection 641. The waveform 652 corresponds to the DL8 output on connection 642. The waveform 653 corresponds to the signal input to the adder 627 on connection 624. The waveform 654 corresponds to the signal input to the adder 627 on connection 626. The waveform 655 corresponds to the detection signal on connection 628 and the waveform 656 corresponds to the counter reset signal on connection 645.

Figure 7:
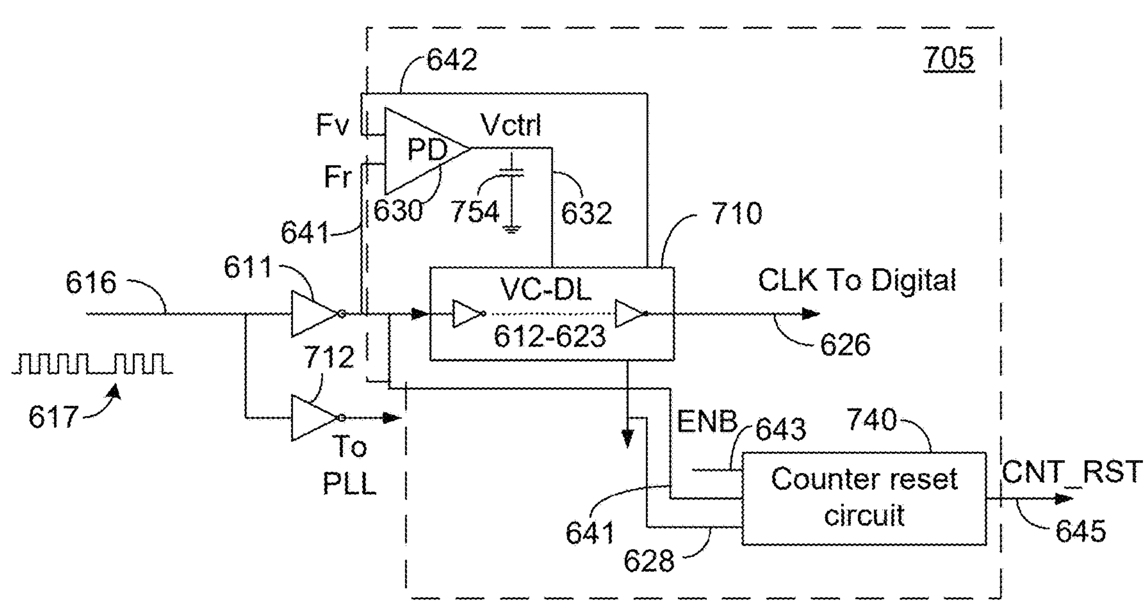
FIG. 7 is a diagram showing an exemplary embodiment of a phase alignment circuit including an exemplary embodiment of the missing pulse detection circuit of FIG. 4 and FIG. 6.

FIG. 7 is a diagram showing an exemplary embodiment of a phase alignment circuit including an exemplary embodiment of the missing pulse detection circuit of FIG. 4 and FIG. 6. In an exemplary embodiment, the modified reference signal 617 is applied over connection 616 to the amplifier 611. The signal on connection 616 is also applied to an amplifier 712.

An output of the amplifier 611 is provided to a missing pulse detection circuit 705. The missing pulse detection circuit 705 is an exemplary embodiment of the missing pulse detection circuit 605 of FIG. 6.

An output of the amplifier 712 is provided to a PLL circuit, such as the PLL circuit 423 of FIG. 4.

In an exemplary embodiment, the missing pulse detection circuit 705 includes a delay line circuit 710, the phase comparator and voltage generator circuit 630 and a counter reset circuit 740. The delay line circuit 710 in FIG. 7 generally comprises the delay line circuit 610 and the detection circuit 620 of FIG. 6.

In an exemplary embodiment, the output of the amplifier 611 is provided over connection 641 to the phase comparator and voltage generator circuit 630 as a reference input Fr. An output of the delay line circuit 710 on connection 642 is provided to the phase comparator and voltage generator circuit 630 over connection 642 as a feedback input, Fv.

A delay loop control signal, Vctrl, is provided from the phase detector 630 over connection 632 to the delay line circuit 710. The delay loop control signal on connection 632 is an analog voltage signal that controls the signal delay of the delay line stages in the delay line circuit 710. A capacitance 754 is also connected between the connection 752 and system ground.

An output of the delay line circuit 710 is also provided over connection 626 to other elements in the digital circuitry (not shown in FIG. 7).

In an exemplary embodiment, the counter reset circuit 740 receives the enable signal on connection 643, receives the DL0 output over connection 641 and receives the detection pulse signal over connection 628.

An output of the counter reset circuit 740 is provided over connection 645 as the CNT-RST signal, which is applied to the counter 433 (FIG. 4) in the RFIC 422 and in each of the RFICs 424, 426 and 428 to establish an absolute time and frequency reference point.

Figure 8:
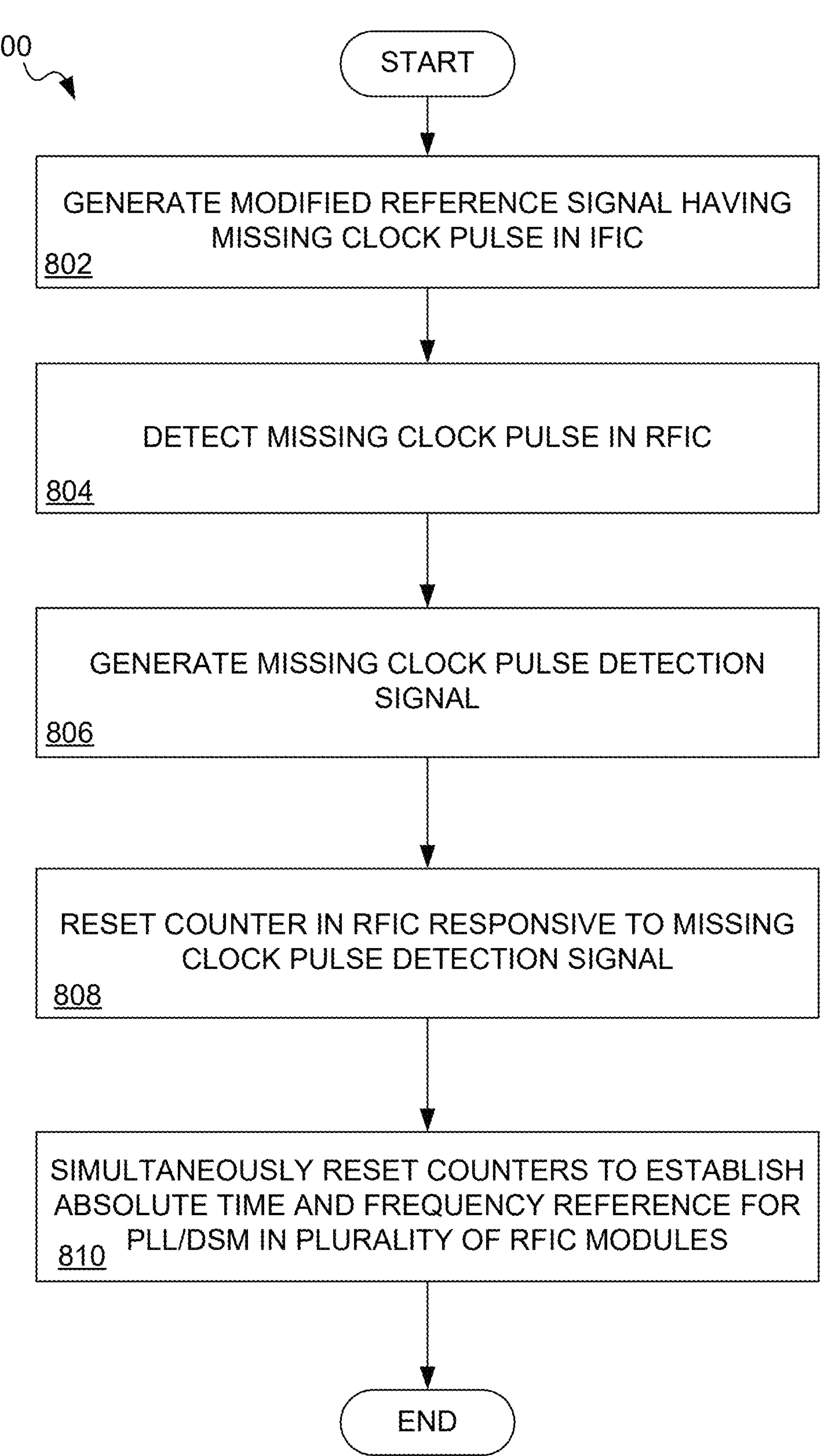
FIG. 8 is a flow chart describing an example of the operation of a method for phase alignment.

FIG. 8 is a flow chart 800 describing an example of the operation of a method for phase alignment. The blocks in the method 800 can be performed in or out of the order shown, and in some embodiments, can be performed at least in part in parallel.

In block 802, a modified reference signal having a missing clock pulse is generated in an IFIC. For example, the missing pulse generator circuit 513 may generate a clock signal 550/517 having one or more missing clock pulses.

In block 804, the missing clock pulse is detected in the RFIC. For example, the missing pulse detection circuit 605 detects a missing clock pulse in the modified reference signal.

In block 806, a missing clock pulse detection signal is generated. For example, the detection circuit 620 generates a missing clock pulse detection signal on connection 628.

In block 808, a counter in a RFIC is reset responsive to the missing clock pulse detection signal. For example, the counter reset circuit 640 generates a counter reset (CNT_RST) signal on connection 645 and resets the counter 433 in the RFIC 422.

In block 810, a counter output in each RFIC is sent to a corresponding DSM in each PLL. For example, the output of each counter (such as counter 433) is simultaneously sent to a corresponding DSM (such as the 434) in each corresponding PLL (such as PLL 422) for each respective RFIC 422, 424, 426 and 428 to establish an absolute time and frequency reference for each respective RFIC 422, 424, 426 and 428.

Figure 9:
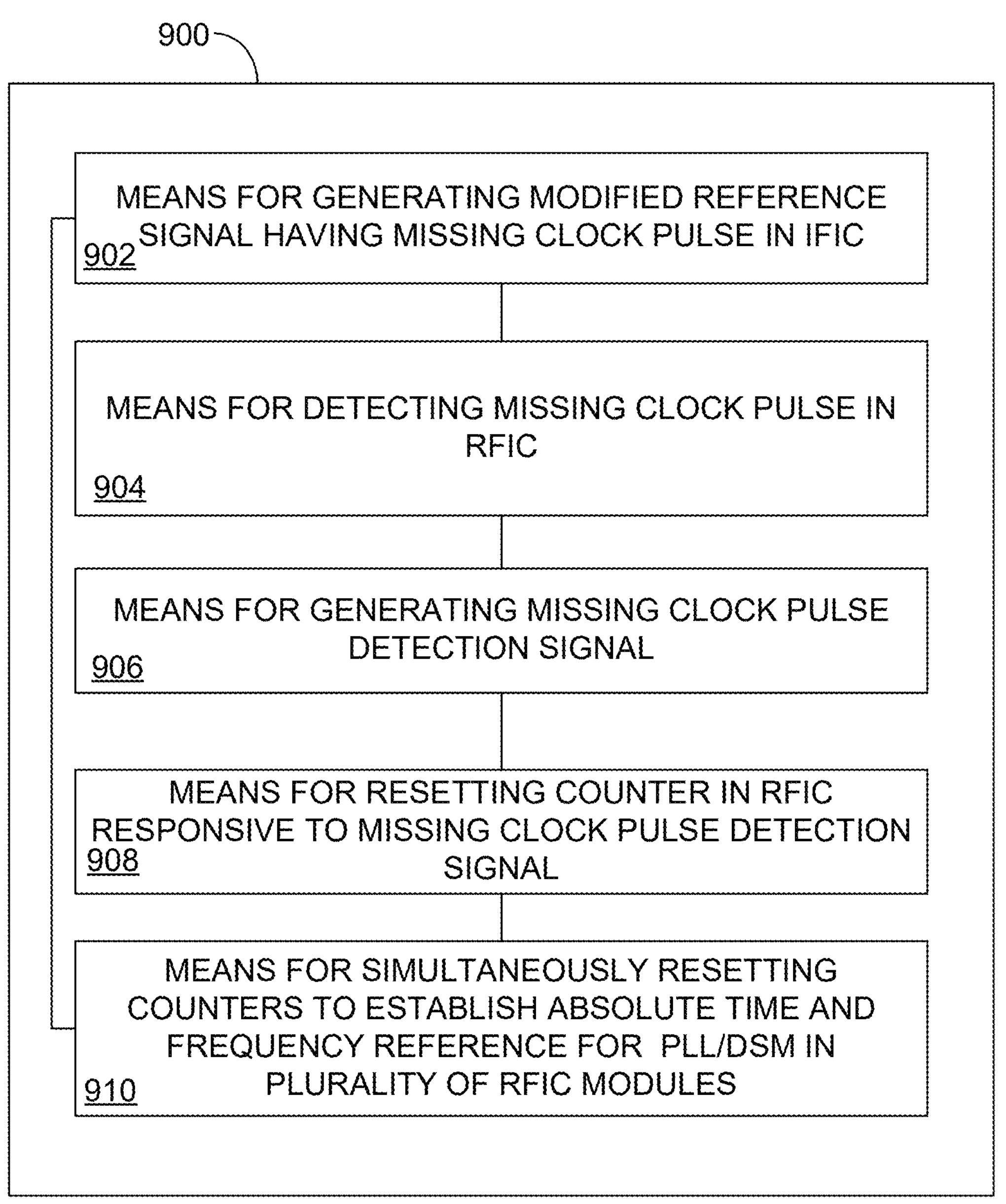
FIG. 9 is a functional block diagram of an apparatus for phase alignment.

FIG. 9 is a functional block diagram of an apparatus 900 for phase alignment. The apparatus 900 comprises means 902 for generating a modified reference signal having a missing clock pulse. In certain embodiments, the means 902 can be configured to perform one or more of the functions described in operation block 802 of method 800 (FIG. 8). In an exemplary embodiment, the means 902 may comprise the missing pulse generator circuit 513 configured to generate a clock signal 550/517 having one or more missing clock pulses.

The apparatus 900 also comprises means 904 for detecting the missing clock pulse. In certain embodiments, the means 904 can be configured to perform one or more of the functions described in operation block 804 of method 800 (FIG. 8). In an exemplary embodiment, the means 904 may comprise the missing pulse detection circuit 605 configured to detect a missing clock pulse in the modified reference signal.

The apparatus 900 also comprises means 906 for generating a missing clock pulse detection signal. In certain embodiments, the means 906 can be configured to perform one or more of the functions described in operation block 806 of method 800 (FIG. 8). In an exemplary embodiment, the means 906 may comprise the detection circuit 620 configured to generate a missing clock pulse detection signal on connection 628.

The apparatus 900 also comprises means 908 for resetting a counter in an RFIC responsive to the missing clock pulse detection signal. In certain embodiments, the means 908 can be configured to perform one or more of the functions described in operation block 808 of method 800 (FIG. 8). In an exemplary embodiment, the means 908 may comprise the counter reset circuit 640 configured to generate a counter reset (CNT_RST) signal on connection 645 and reset the counter 433 in the RFIC 422.

The apparatus 900 also comprises means 910 for sending a counter output in each RFIC to a corresponding DSM in each PLL to establish an absolute time and frequency reference point. In certain embodiments, the means 910 can be configured to perform one or more of the functions described in operation block 108 of method 800 (FIG. 8). In an exemplary embodiment, the means 910 may comprise one or more counters (such as counter 433) configured to output, e.g., approximately concurrently or simultaneously, to a corresponding DSM (such as the 434) in each corresponding PLL (such as PLL 422) for each respective RFIC 422, 424, 426 and 428 to establish an absolute time and frequency reference for each respective RFIC 422, 424, 426 and 428.

Examples above include using a missing pulse to synchronize time and/or phase across multiple RFICs. It will be understood, however, that other techniques may be used in accordance with the concepts described herein. For example, other indicators in the clock signal may be used to trigger a counter and/or reset a PLL in an RFIC. One example includes a pulse having a width that is twice as wide as normal, or a pulse of increased amplitude.

Implementation examples are described in the following numbered clauses:

1. A system for phase alignment, comprising: a radio frequency integrated circuit (RFIC) having a phase locked loop (PLL) circuit and a missing pulse detection circuit, the missing pulse detection circuit configured to detect a missing pulse from a reference clock source and generate a detection pulse signal; and a counter reset circuit connected to the missing pulse detection circuit, the counter reset circuit configured to generate a counter reset signal in response to the detection pulse signal, the counter reset signal configured to establish an absolute time and frequency reference for the PLL circuit.
2. The system of clause 1, wherein the PLL comprises a fractional-N PLL.
3. The system of any of clauses 1 through 2, further comprising an intermediate frequency integrated circuit (IFIC) having a missing pulse generator circuit configured to generate a modified reference clock signal having at least one missing clock pulse.
4. The system of any of clauses 1 through 3, wherein the missing pulse detection circuit comprises a delay line circuit, a detection circuit and the counter reset circuit.
5. The system of clause 4, wherein the delay line circuit comprises eight (8) delay line stages.
6. The system of clause 5, wherein the detection circuit comprises three (3) delay line stages.
7. The system of clause 4, wherein the counter reset circuit comprises an adder and a flip-flop.
8. The system of any of clauses 1 through 7, wherein the counter reset signal is provided to a delta-sigma modulator (DSM) in the PLL circuit.
9. The system of any of clauses 1 through 8, wherein the counter reset signal is simultaneously provided to a plurality of delta-sigma modulators (DSMs) in a plurality of PLL circuits.
10. The system of clause 6, further comprising a phase comparator and voltage generator circuit configured to compare an output of a first delay line stage with an output of a last delay line stage to generate a one cycle delayed version of the reference clock source.
11. The system of clause 10, wherein the one cycle delayed version of the reference clock controls the signal delay of the delay line stages in the delay line circuit and detection circuit.
12. A method for phase alignment, comprising: detecting a missing pulse in a clock signal; generating a detection pulse signal; and generating a counter reset signal to reset a counter in response to the detection pulse signal, wherein resetting the counter establishes an absolute time and frequency reference.
13. The method of clause 12, further comprising resetting a plurality of counters to establish an absolute frequency reference for a plurality of phase locked loop (PLL) circuits.
14. The method of clause 13, wherein the PLL circuit is located in a radio frequency integrated circuit (RFIC).
15. The method of any of clauses 13 through 14, wherein the PLL circuit comprises a fractional-N PLL.
16. The method of any of clauses 13 through 15, further comprising generating the clock signal having the missing pulse.
17. A device, comprising: means for detecting a missing pulse in a clock signal; means for generating a detection pulse signal; and means for generating a counter reset signal to reset a counter in response to the detection pulse signal, wherein resetting the counter establishes an absolute time and frequency reference.
18. The device of clause 17, further comprising means for resetting a plurality of counters to establish an absolute frequency reference for a plurality of phase locked loop (PLL) circuits.
19. The device of clause 18, wherein the PLL circuit is located in a radio frequency integrated circuit (RFIC).
20. The device of any of clauses 17 through 19, wherein the PLL circuit comprises a fractional-N PLL.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A system for phase alignment, comprising:

a radio frequency integrated circuit (RFIC) having a phase locked loop (PLL) circuit and a missing pulse detection circuit, the missing pulse detection circuit configured to detect a missing pulse from a reference clock source and generate a detection pulse signal; and a counter reset circuit connected to the missing pulse detection circuit, the counter reset circuit configured to generate a counter reset signal in response to the detection pulse signal, the counter reset signal configured to establish an absolute time and frequency reference for the PLL circuit.

2. The system of claim 1, wherein the PLL comprises a fractional-N PLL.

3. The system of claim 1, further comprising an intermediate frequency integrated circuit (IFIC) having a missing pulse generator circuit configured to generate a modified reference clock signal having at least one missing clock pulse.

4. The system of claim 1, wherein the missing pulse detection circuit comprises a delay line circuit, a detection circuit and the counter reset circuit.

5. The system of claim 4, wherein the delay line circuit comprises eight (8) delay line stages.

6. The system of claim 5, wherein the detection circuit comprises three (3) delay line stages.

7. The system of claim 6, further comprising a phase comparator and voltage generator circuit configured to compare an output of a first delay line stage with an output of a last delay line stage to generate a one cycle delayed version of the reference clock source.

8. The system of claim 7, wherein the one cycle delayed version of the reference clock controls the signal delay of the delay line stages in the delay line circuit and detection circuit.

9. The system of claim 4, wherein the counter reset circuit comprises an adder and a flip-flop.

10. The system of claim 1, wherein the counter reset signal is provided to a delta-sigma modulator (DSM) in the PLL circuit.

11. The system of claim 1, wherein the counter reset signal is simultaneously provided to a plurality of delta-sigma modulators (DSMs) in a plurality of PLL circuits.

12. A method for phase alignment, comprising:

detecting a missing pulse in a clock signal;

generating a detection pulse signal; and generating a counter reset signal to reset a counter in response to the detection pulse signal, wherein resetting the counter establishes an absolute time and frequency reference.

13. The method of claim 12, further comprising resetting a plurality of counters to establish an absolute frequency reference for a plurality of phase locked loop (PLL) circuits.

14. The method of claim 13, wherein the PLL circuit is located in a radio frequency integrated circuit (RFIC).

15. The method of claim 13, wherein the PLL circuit comprises a fractional-N PLL.

16. The method of claim 13, further comprising generating the clock signal having the missing pulse.

17. A device, comprising:

means for detecting a missing pulse in a clock signal;

means for generating a detection pulse signal; and means for generating a counter reset signal to reset a counter in response to the detection pulse signal, wherein resetting the counter establishes an absolute time and frequency reference.

18. The device of claim 17, further comprising means for resetting a plurality of counters to establish an absolute frequency reference for a plurality of phase locked loop (PLL) circuits.

19. The device of claim 18, wherein the PLL circuit is located in a radio frequency integrated circuit (RFIC).

20. The device of claim 17, wherein the PLL circuit comprises a fractional-N PLL.

* * * * *